(12) United States Patent
Starr et al.

(10) Patent No.: US 6,843,574 B2
(45) Date of Patent: Jan. 18, 2005

(54) GIMBALED MICROMECHANICAL ROTATION SYSTEM

(75) Inventors: James Starr, New Brighton, MN (US); Mitchell J. Novack, Kenmore, WA (US); Haesung Kwon, San Jose, CA (US); James H. Smith, San Diego, CA (US); Steven S. Nasiri, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 10/225,081

(22) Filed: Aug. 20, 2002

(65) Prior Publication Data

US 2004/0037492 A1 Feb. 26, 2004

(51) Int. Cl.[7] ............................................. G02B 7/182
(52) U.S. Cl. ..................... 359/871; 359/224; 359/876; 248/587; 248/593
(58) Field of Search ................. 359/198, 199, 359/212, 214, 223, 225, 226, 871, 872, 876; 248/476, 479, 560, 564–565, 582–585, 587, 592–593, 605, 614, 651, 660

(56) References Cited

U.S. PATENT DOCUMENTS

| | | |
|---|---|---|
| 5,535,047 A | 7/1996 | Hornbeck |
| 5,583,688 A | 12/1996 | Hornbeck |
| 5,648,618 A | 7/1997 | Neukermans et al. |
| 5,867,302 A | 2/1999 | Fleming |
| 5,960,132 A | 9/1999 | Lin ............................. 385/18 |
| 6,028,689 A | 2/2000 | Michalicek et al. ........ 359/224 |
| 6,040,935 A | 3/2000 | Michalicek ................. 359/198 |
| 6,040,953 A | 3/2000 | Malone et al. ................ 360/53 |
| 6,044,705 A | 4/2000 | Neukermans et al. .... 73/504.02 |
| 6,198,180 B1 | 3/2001 | Garcia |
| 6,256,134 B1 | 7/2001 | Dhular et al. |
| 6,283,601 B1 | 9/2001 | Hagelin et al. ............. 359/871 |
| 6,366,414 B1 | 4/2002 | Aksyuk et al. |
| 6,466,356 B1 | 10/2002 | Peeters et al. |
| 6,733,144 B2 * | 5/2004 | Kwon ........................ 359/876 |

FOREIGN PATENT DOCUMENTS

| | | |
|---|---|---|
| WO | WO 01/88594 | 11/2001 |
| WO | WO 01/96930 | 12/2001 |

OTHER PUBLICATIONS

De Gaspari, J., "MEM's Rocky Road," *Mechanical Engineering*, Jun., 2002, p. 38.
U.S. patent application Ser. No. 09/779,189 filed Feb. 7, 2001.
U.S. patent application Ser. No. 09/894,021 filed Jun. 27, 2001.
Publication No. 20010030817 A1.
Pub. No. 20010048265 A1.
Toshiyoshi, et al., "Electrostatic Micro Torsion Mirrors for an Optical Switch Matrix," Journal of Microelectromechanical Systems, vol. 5, No. 4, Dec. 1996.

* cited by examiner

*Primary Examiner*—James Phan
(74) *Attorney, Agent, or Firm*—Blakely, Sokoloff, Taylor & Zafman LLP

(57) ABSTRACT

The present invention is directed towards apparatuses for rotating a gimbaled platform with rotatable actuators. Gimbal springs comprised of component springs with compliant axes that intersect at a nonzero angle are coupled to the gimbaled platform. Preferably, the compliant axes of the component springs are oriented at an approximately 45 degree angle relative to the actuator rotation axes. Wrap-around lever arms coupling the rotatable actuators with the gimbal springs serve to increase the leverage ratio, thereby permitting greater platform rotation for a given actuator rotation.

64 Claims, 14 Drawing Sheets

GIMBALED MICROMECHANICAL ROTATION SYSTEM

FIELD OF THE INVENTION

The present invention relates to a system for rotating a platform. In particular, it relates to a gimbaled micromechanical platform rotation system.

BACKGROUND OF THE INVENTION

Fiber optic networks have the potential for greatly increasing telecommunication bandwidths and data rates. The demand for increased capacity continues to grow, especially as more and more information is transmitted across the Internet.

One limitation of fiber optic networks as currently implemented is their inability to directly switch from a fiber on a source network or network node to a fiber on a destination network or network node. Instead, optically encoded data are dropped from the source network fiber, converted to electrically encoded data, switched to the destination network using conventional electronic switches, converted back into optically encoded data, and injected into the destination network fiber.

Micromachined mirror arrays offer the ability to directly switch optically encoded data in devices, known as all-optical cross connect switches, from a source fiber on a source network to a destination fiber on a destination network without having to convert the data from optical to electronic and back again. For such mirror arrays to be commercially useful, they must be able to cross connect approximately 1000 input fibers with an equal number of output fibers in a compact volume. This can be achieved with mirrors that can be densely packed together and that are rotatable by relatively large angles in an arbitrary angular direction.

Recent developments in the field of microelectomechanical systems (MEMS) allow for the bulk production of microelectromechanical mirrors and mirror arrays that can be used in all-optical cross connect switches. MEMS-based mirrors and mirror arrays can be inexpensively designed and produced using conventional tools developed for the design and production of integrated circuits (IC's). Such tools include computer-aided design (CAD), photolithography, bulk and surface micromachining, wet and dry isotropic and anisotropic etching, and batch processing. In addition, deep reactive ion etching methods (DRIE) allow silicon devices to be produced having high aspect ratios (~20:1) that rival those that can be achieved using the prohibitively expensive lithography, electroplating and molding process (LIGA) which requires access to a synchrotron radiation source. (LIGA is an acronym for the German lithographic, galvanoformung und abformung).

A number of microelectromechanical mirror arrays have already been built using MEMS production processes and techniques.

A dual-axis design was developed by Analog Devices (De Gaspari, J., "MEM's Rocky Road," *Mechanical Engineering*, June, 2002, p.38.). In this device, the mirror is suspended by a first set of opposing springs in a rotatable frame. The rotatable frame is suspended by second set of opposing springs that allow rotation in an orthogonal direction. Although this approach allows for dual axis rotation, the method of actuation is unclear and the frame requires additional space that limits how closely packed the mirrors can be arranged.

In U.S. Pat. No. 6,283,601, Hagelin et al disclose a mirror system in which the mirror is fixed to a post mounted on a support plate. The support plate is rotated by connectors that tilt the edge of the support plate in response to actuator displacements. An issue not addressed in Hagelin et al is the desire to rotate the mirror without displacement.

In U.S. patent application Ser. No. 09/779189 of Nasiri, filed on Feb. 7, 2001, and hereby incorporated by reference in its entirety, a mirror is mounted on a support post mounted on a freely moving plate. In Nasiri, two orthogonally oriented pairs of rotatable actuators are coupled to the freely moving plate by gimbal springs. By properly coordinating each pair of actuators, the plate center can be rotated without displacement under ideal conditions.

Although the Nasiri application shows improved ability to manipulate the plate center without displacement, the performance of similar configurations can be greatly improved by paying special attention to the system used for transmitting rotation from the actuators to the freely moving plate.

SUMMARY OF THE INVENTION

The current invention provides improved means for rotating a gimbaled platform with rotatable actuators. Each rotatable actuator rotates about its actuator axis. The rotation of multiple rotatable actuators about their respective axes is arranged such that the gimbaled platform can be rotated to desired orientations. Although the invention has been motivated by the needs of micro-mirror arrays, the invention may be applied to other situations where rotatable actuators are used.

A feature of several embodiments of the present invention is the ability to increase the leverage ratio with minimal or no increase in the size of the device. As shown in FIG. 1A, the leverage ratio is $R=\theta_p/\theta_a$ where $\theta_a$ is the angle that the actuator 1100 rotates and $\theta_p$ is the angle that the gimbaled platform 110 rotates. Large values of the leverage ratio R imply that small actuator rotations induce large rotations of the gimbaled platform 110. For small angles of rotation, where the rotation angle in radians is appropriately approximated by the sine of the angle, the leverage ratio can be approximated by L/D. In this expression, L is the distance from the rotation axis of the actuator 1100 to its pivot with the gimbaled platform 110 and D is the distance from that pivot to the rotation axis of the gimbaled platform 110.

One way to increase the leverage ratio is to make L larger. Traditionally, this involves moving the actuator 1100 further from the gimbaled platform 110 as shown in FIG. 1B. This decreases the actuator rotation angle $\theta_a$ for the same rotation angle $\theta_p$ of the gimbaled platform. Unfortunately, this also increases the size of the device.

Another approach to increase L is to employ a wrap-around approach, as is illustrated in FIG. 1C. In the wrap-around approach, both the actuator 1100 and the gimbaled platform 110 rotate in the same sense. In FIG. 1C, the actuator angle $\theta_a$ is held constant while the angle $\theta_p$ of the gimbaled platform 110 increases considerably. The space required for the configuration of FIG. 1C is approximately the same as that required for FIG. 1A.

An alternative approach to increasing the leverage ratio is to decrease the distance D. Clearly decreasing the size of the gimbaled platform 110 achieves this goal, but D can be decreased with the same size gimbaled platform 110 by changing the location of the pivot, as shown in FIG. 1D. In FIG. 1D, the angle $\theta_p$ of the gimbaled platform 110 is the same as that in FIG. 1A, but the actuator angle $\theta_a$ is much smaller, thereby increasing the leverage ratio. The location of the pivot can be changed by changing the location of the connection to the gimbaled platform 110 or by changing the effective pivot of gimbal springs, as will be discussed in the Detailed Description of the Preferred Embodiments.

Another feature of preferred embodiments is reduced out-of-plane displacement of the gimbal springs. A lever arm that extends from the actuator is coupled to the gimbaled platform through the use of the gimbal springs. These springs flex to provide pivoting capability. Out-of-plane motion of the gimbal springs can result in mechanical interference during operation.

In the present invention, gimbal springs comprise at least two component springs coupled in series. Each component spring has a component compliant axis about which it flexes. The component compliant axes of the component springs intersect at an angle, preferably approximately 90 degrees. Preferably, none of the component compliant axes of the component springs are aligned with the actuator axis of the driving rotatable actuator. Most preferably, all of the component compliant axes of the component springs make an angle of approximately 45 degrees with the actuator axis. This configuration reduces the out-of-plane displacement of the gimbal springs during operation.

Additional features and advantages of the invention will be set forth in part in the description that follows, and in part will be obvious from the description, or may be learned by practice of the invention. Various embodiments of the invention do not necessarily include all of the stated features or achieve all of the stated advantages.

BRIEF DESCRIPTION OF THE DRAWINGS

The accompanying drawings illustrate a complete embodiment of the invention according to the best modes so far devised for the practical application of the principles thereof, and in which:

FIG. 1A illustrates the basic principle of the leverage ratio; FIG. 1B illustrates how the leverage ratio is increased by increasing L; FIG. 1C illustrates how a wraparound lever increases the leverage ratio in a compact space; and FIG. 1D illustrates how the leverage ratio is increased by decreasing D.

FIG. 4A shows a plan view of a gimbal spring comprised of two component springs, each with many legs having depth greater than width. FIG. 4B shows a plan view of a gimbal spring with two component springs, each of which has width greater than depth. FIG. 4C shows a plan view of a gimbal spring having component spring pairs. FIG. 4D illustrates a variation of the gimbal spring shown in FIG. 4A with the orientation of the component compliant axes arranged such that they intersect in the gimbaled platform.

FIGS. 5 illustrate two four-actuator embodiments.

FIGS. 6 illustrate another four-actuator embodiment.

DETAILED DESCRIPTION OF PREFERRED EMBODIMENTS

Figure 2:
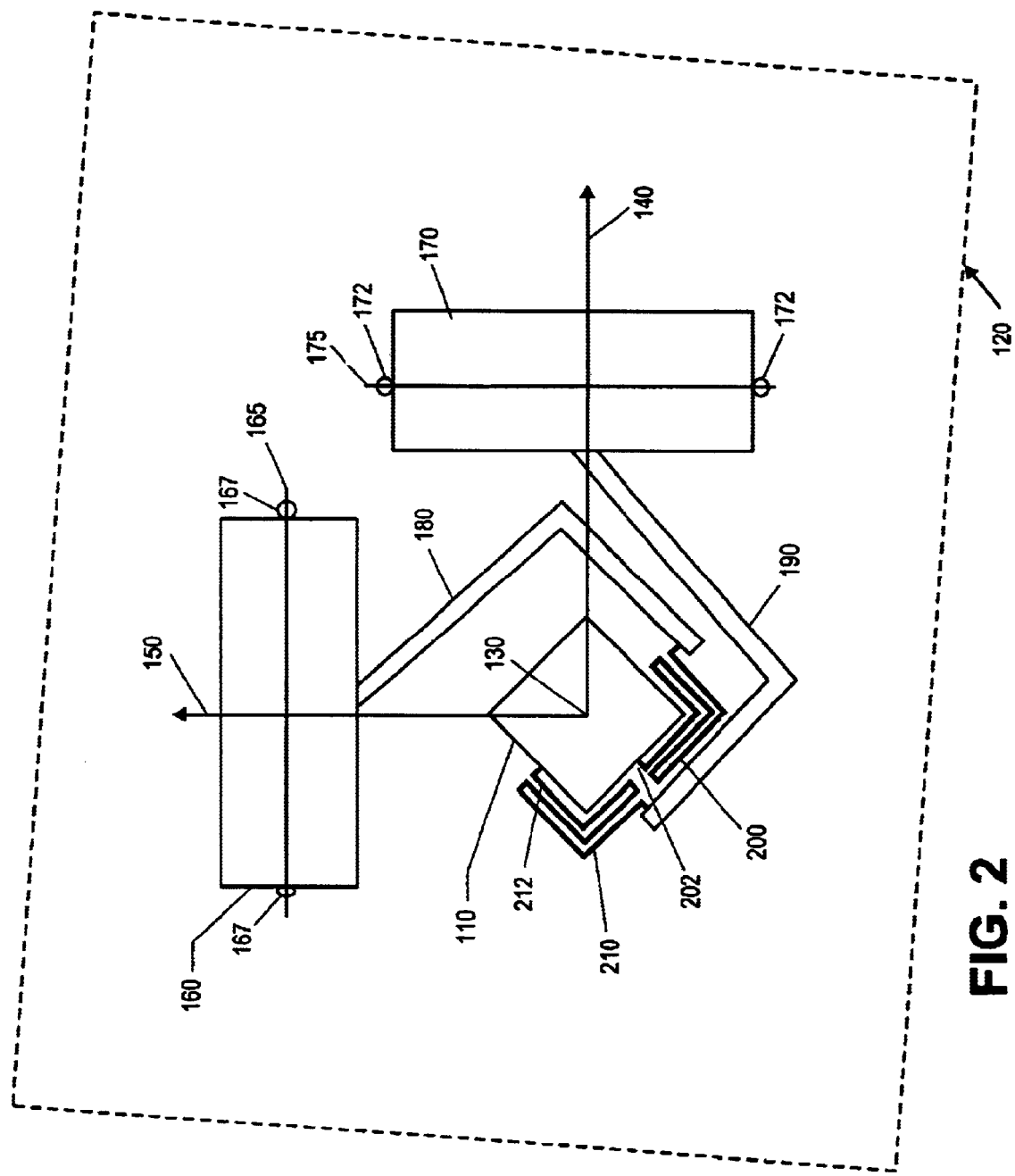
FIG. 2 shows a plan view of a two-actuator configuration.

Referring now to the drawings, where similar elements are numbered the same, FIG. 2 depicts an apparatus for rotating a gimbaled platform 110 about an x-axis 140 and a y-axis 150. The intersection of the x-axis 140 and the y-axis 150 define a gimbal origin 130. Because they intersect, the x-axis 140 and the y-axis 150 also define a gimbal plane 120. A first x-rotatable actuator 160 rotates about a first x-actuator axis 165, which is substantially parallel to the x-axis 140 and is disposed in the gimbal plane 120. Similarly, a first y-rotatable actuator 170 rotates about a first y-actuator axis 175, which is substantially parallel to the y-axis 150 and is disposed in the gimbal plane 120. Although the gimbal plane 120 is analytically defined in terms of the x-axis 140 and the y-axis 150, because the actual gimbaled platform 110 has a finite depth perpendicular to the gimbal plane 120, for practical purposes the gimbal plane 120 is most readily determined by the actuator axes (shown here as 165 and 175), which are disposed in the gimbal plane 120.

The rotatable actuators (160 and 170) may be actuated by the same or different means. The invention disclosed herein does not restrict the actuation means. For example, electrostatic, piezoelectric, electromagnetic, thermal, and fluidic actuation are some of the possible actuation means.

Actuator springs 167 and 172 may also be associated with various embodiments of the invention. However, the form, or even the presence of these springs is not critical to the invention disclosed herein.

As shown in FIG. 2, a first x-wraparound lever arm 180 is coupled to the first x-rotatable actuator 160. The first x-gimbal spring 200 couples the first x-wraparound lever arm 180 to the gimbaled platform 110. The first x-gimbal spring 200 attaches to the gimbaled platform 110 at a first x-gimbal-spring/gimbaled-platform attachment point 202. Similarly, a first y-wraparound lever arm 190 is coupled to the first y-rotatable actuator 170 and the first y-gimbal spring 210 couples the first y-wraparound lever arm 190 to the gimbaled platform 110. The first y-gimbal spring 210 attaches to the gimbaled platform 110 at a first y-gimbal-spring/gimbaled-platform attachment point 212. As discussed in the summary of the invention, the wraparound lever arms increase the leverage ratio without significantly increasing the space required. The use of wraparound lever arms implies that a rotation of the respective rotatable actuators induces a similar sense rotation of the gimbaled platform 110. For instance, the first x-rotatable actuator 160, the first x-wraparound lever arm 180, and the first x-gimbal spring 200 are configured such that a positive rotation of the first x-rotatable actuator 160 about the first x-actuator axis 165 induces a positive rotation of the gimbaled platform 110 about the x-axis 140. Although wraparound lever arms are included in many preferred embodiments, as shown later, some embodiments of the invention do not include wraparound lever arms. In embodiments without wraparound lever arms, the rotation of the gimbaled platform 110 is opposite that of the rotatable actuator.

A variety of gimbal springs may be used for the first x-gimbal spring 200 and first y-gimbal spring 210. Each gimbal spring comprises at least two component springs coupled in series. Each component spring has a component compliant axis and the component compliant axes form an angle relative to each other. The angle is nonzero; in other words, the component compliant axes are not parallel.

Figure 3A:
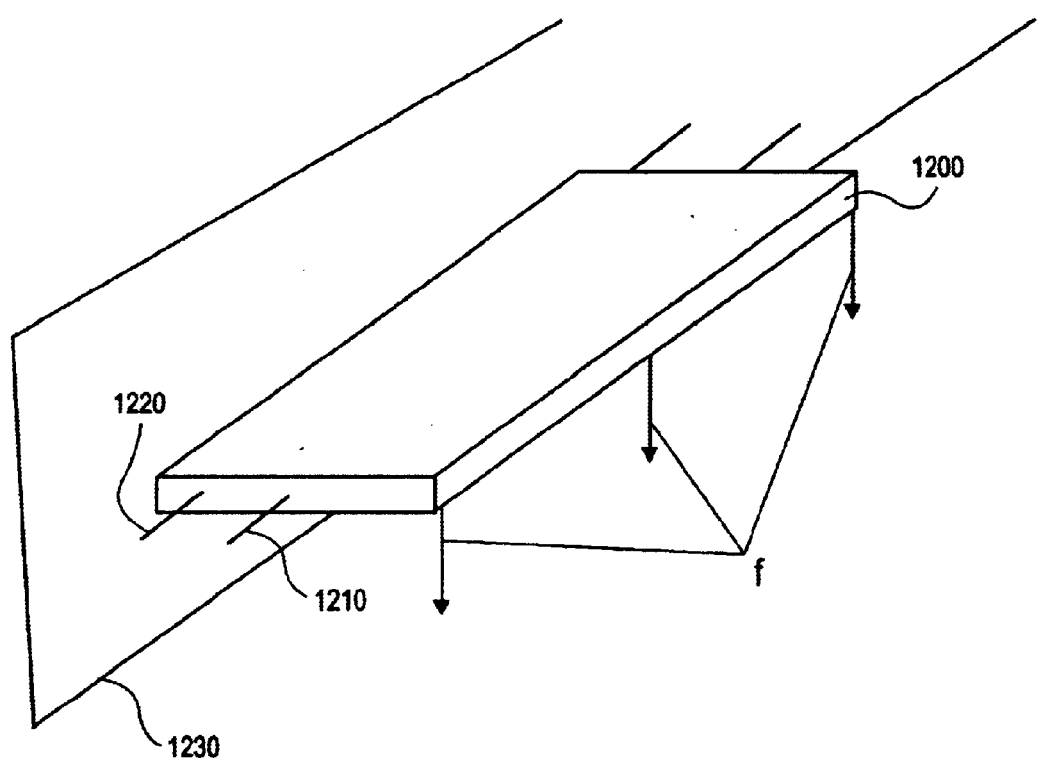
FIG. 3A shows a thin plate used as a leaf spring.
Figure 3B:
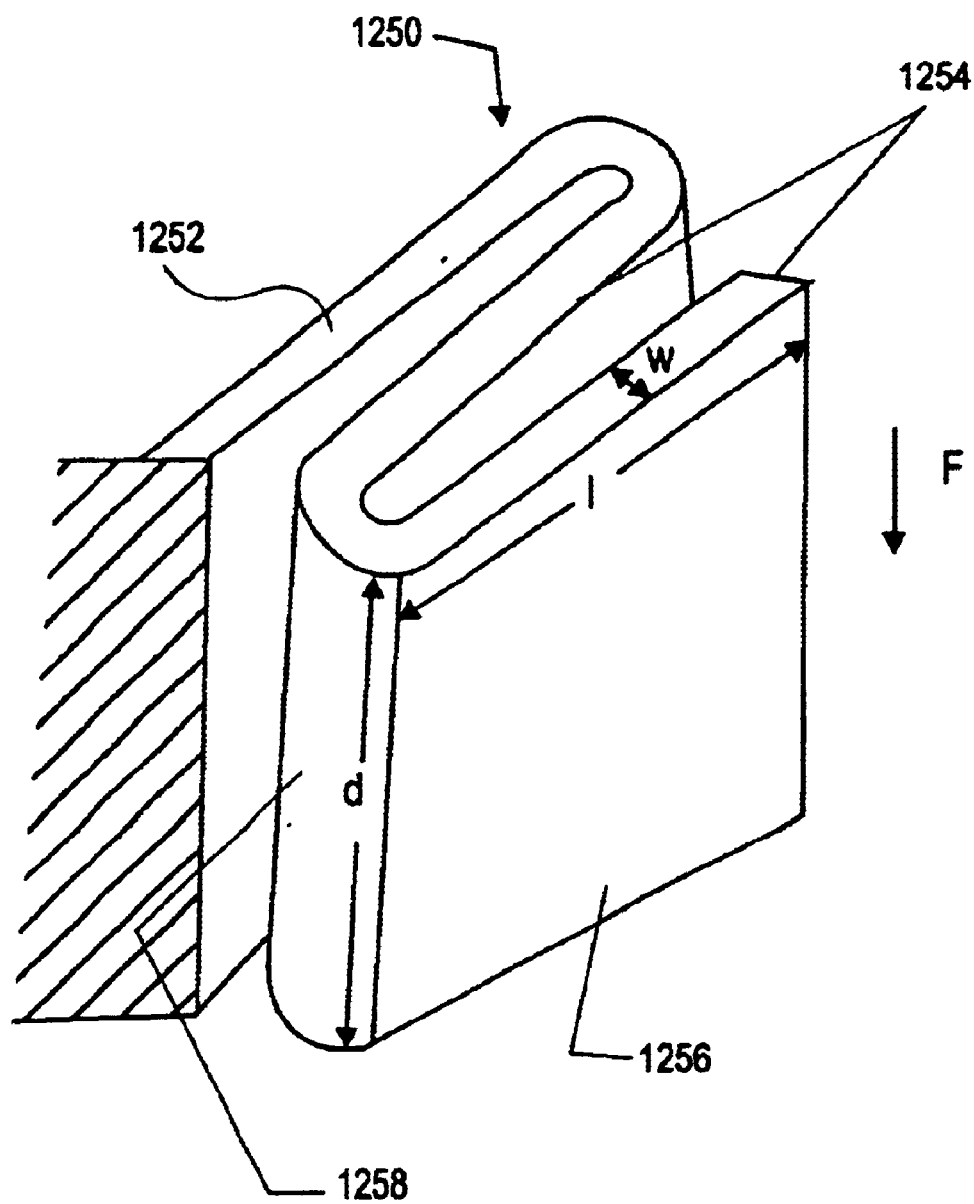
FIG. 3B shows a three spring legs coupled in series to form a component spring.

The component compliant axis is the axis about which the component spring effectively permits rotation. For instance a round rod could act as a torsion spring and twist about its geometric axis when twisted, hence its compliant axis would be its geometric axis. A thin plate could act as a leaf spring and bend, although exactly what axis it bent about would depend upon the details of its mounting. For instance, as shown in FIG. 3A, the thin plate 1200 is cantilevered into wall 1230. When subjected to a uniform force per unit length f, it bends about its compliant axis 1220, which is located closer to the wall 1230 than its geometric centerline 1210. A thin flat plate could also serve as a torsion spring and be twisted about its axis. A common type of component spring employed in various embodiments of the invention includes several thin plates that act as spring legs connected in series, as shown in FIG. 3B. Here the component spring 1250 is comprised of spring legs 1252, 1254, and 1256 that are connected in series. When subjected to a force F applied to the end of spring leg 1256, each individual spring leg twists, such that the tops of the spring legs 1252, 1254, and 1256 separate, while the bottoms of the spring legs 1252, 1254, and 1256 get closer together. The combined effect of the twisting of the spring legs 1252, 1254, and 1256 is to have the component spring 1250 bend about a compliant axis 1258. Because the compliant axes of the individual elements do not always correspond to the compliant axis of the complete unit, whenever the term compliant axis is used, it refers to the compliant axis of the unit considered. In addition, for future reference, the leg length is the length of a spring leg measured parallel to the compliant axis of the component spring. The leg width is measured perpendicular to the component compliant axis, but in the gimbal plane, and the leg depth is measured perpendicular to the gimbal plane. For a typical embodiment discussed below, the leg length, width, and depth are indicated on FIG. 3B with the letters l, w, and d respectively.

In preferred embodiments, the component compliant axes of the component springs of the gimbal spring are substantially orthogonal and each component compliant axis forms an angle of approximately 45 degrees with respect to both the x-axis and the y-axis. Examples of such configurations are shown in FIGS. 4A–D.

Figure 4A:
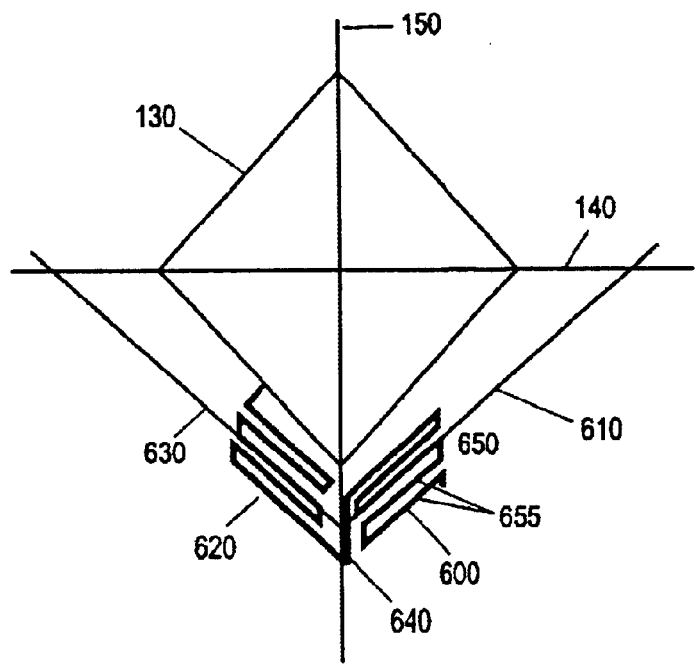
FIGS. 4A–D illustrate gimbal spring variations.

FIG. 4A shows a first component spring 600 comprising spring legs 655 coupled in series. For clarity, only two of the spring legs are labeled; similarly drawn structures should be understood to be spring legs. Although the plan view does not indicate depth, in such a configuration, the leg depth is substantially greater than the leg width. In practice, a typical leg length would be approximately 100 $\mu$m, a typical leg width would be approximately 2–3 $\mu$m, and a typical leg depth would be approximately 30 $\mu$m. Although the illustrations and discussion here focus on spring legs with substantially constant dimensions, especially in width and depth, one skilled in the art would appreciate that these concepts are readily extended to nonconstant dimensions, differing either for different spring legs, or even differing in the same spring leg. Springs having nonconstant dimensions are included within the broad scope of this invention.

In FIG. 4A, the first component compliant axis 610 makes an approximately 45 degree angle with the y-axis 150 and also the x-axis 140. Similarly, the second component spring 620 has a second component compliant axis 630 that makes an approximately 45 degree angle with the y-axis 150 and also the x-axis 140. Note that the effective pivot of the gimbal spring is at the intersection of the component compliant axes of the component springs. In this case that intersection occurs on the y-axis 150. In the most preferred embodiments, the intersection of the component compliant axes of an x-gimbal spring occur on or near the y-axis and the intersection of the component compliant axes of a y-gimbal spring occur on or near the x-axis.

The first 600 and second 620 component springs are coupled through a coupling member 640. The coupling member 640 may be a substantially rigid member, or it may be a flexible member, depending upon the details of the design. A spring-leg gap 650 is shown between adjacent spring legs 655. In the most preferred embodiments, the spring-leg gap is small, most preferably less than approximately 3 $\mu$m. A desirable relative measure of a spring-leg gap suggests that it be less than approximately two times the leg width. However, too small a spring-leg gap might result in adjacent spring legs interfering with one another as they deflect in operation.

Figure 4B:
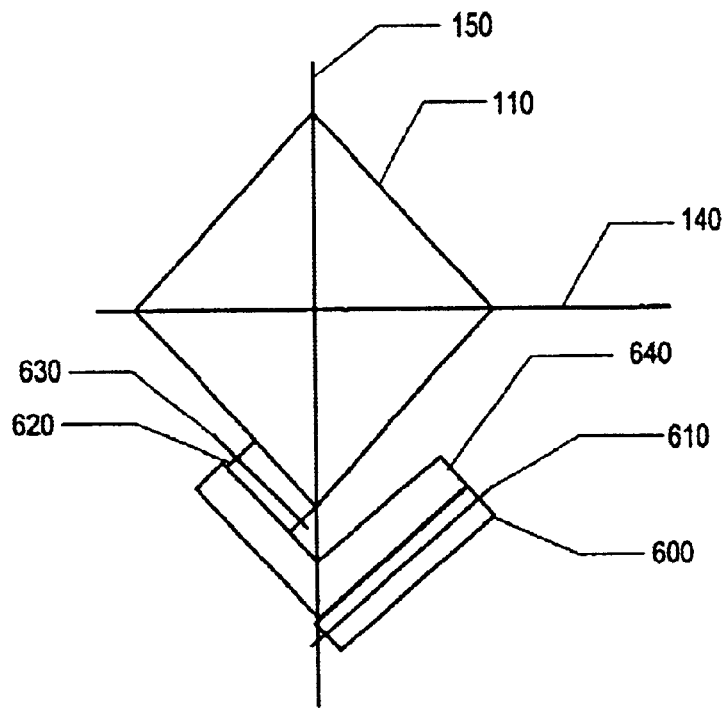

Another embodiment of a gimbal spring is shown in FIG. 4B. Although not clear from the plan view, in this embodiment, the component springs each have one leg with width greater than depth, hence each component spring flexes in a bending mode. The first component spring 600 bends about the first component compliant axis 610 and the second component spring 620 bends about the second component compliant axis 630. A coupling member 640 couples the component springs. The coupling member 640 may be either substantially rigid or it may be flexible.

Figure 4C:
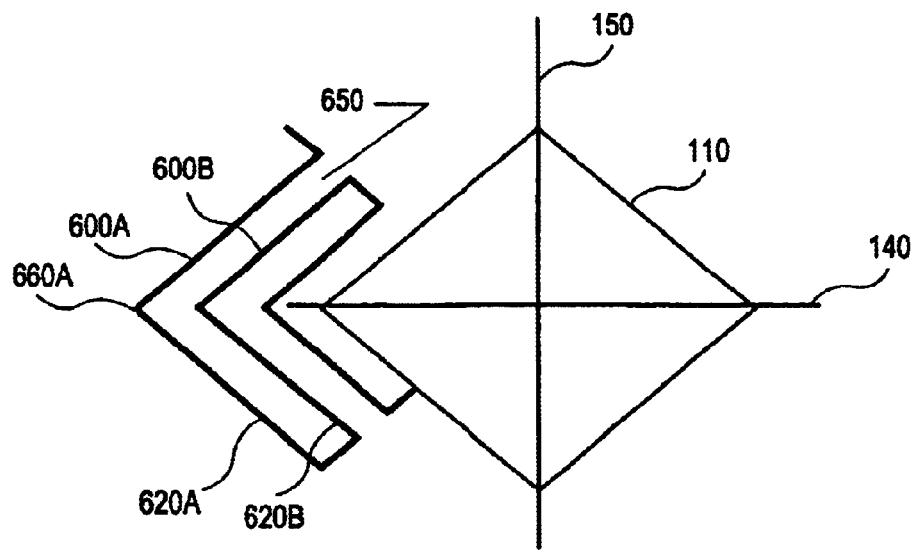

FIG. 4C shows an embodiment in which the component springs form component spring pairs. For instance, a first component spring 600a is coupled in series with a second component spring 620a to form a first component spring pair 660a. Similarly, component spring 600b is coupled in series with component spring 620b to form a second component spring pair 660b. For clarity, only the first two component spring pairs are labeled in the figure. The coupling between the component springs is shown here to be direct, but a flexible or rigid member may be interposed between the component springs. In the preferred embodiment shown here, the component compliant axis of each component spring makes an angle of approximately 45 degrees with respect to the x-axis 140 and the y-axis 150. The effective pivot of the entire gimbal spring will be at a location that is a weighted average of the intersections of the component springs in each component spring pair. The weighted average accounts for the fact that the component springs in adjacent component spring pairs have different lengths, and therefore different stiffnesses. A spring-leg gap 650 between adjacent spring legs 600a and 600b is preferentially small. Most preferably the mean spring-leg gap is less than 3 $\mu$m, or less than two times the leg width.

Figure 1A:
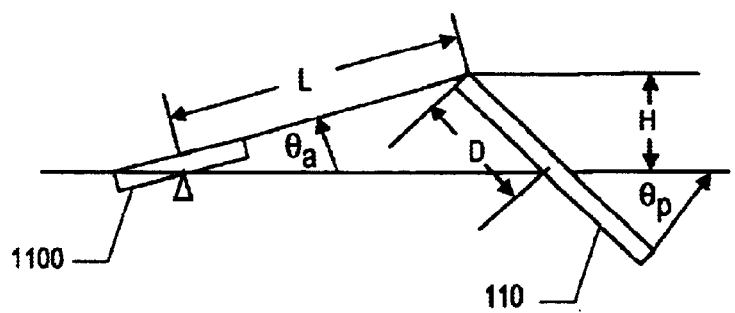
FIGS. 1A–D illustrate ways in which the leverage ratio can be increased. The rotation angles illustrated have been exaggerated relative to what is typically used in practice in order to illustrate the principles. In particular.
Figure 1B:
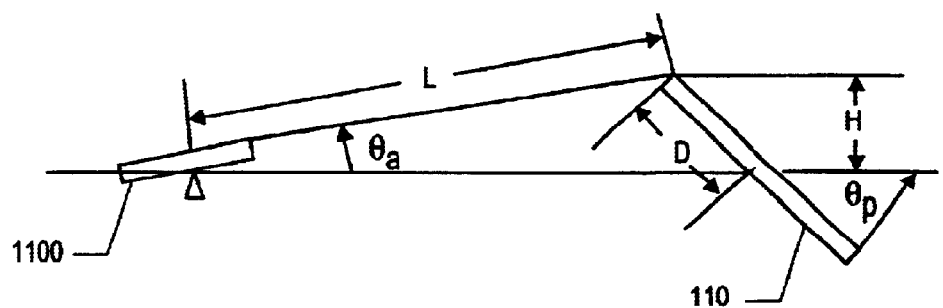
Figure 1C:
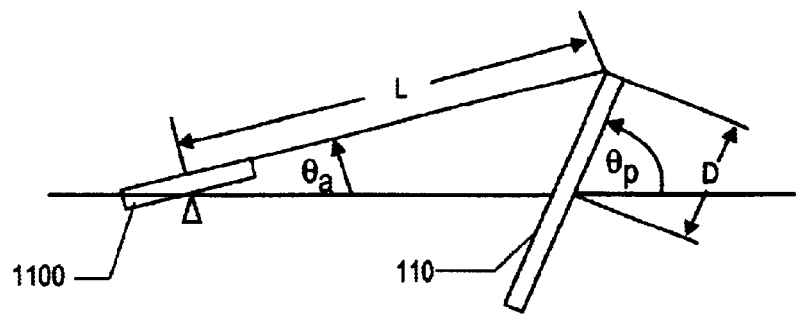
Figure 1D:
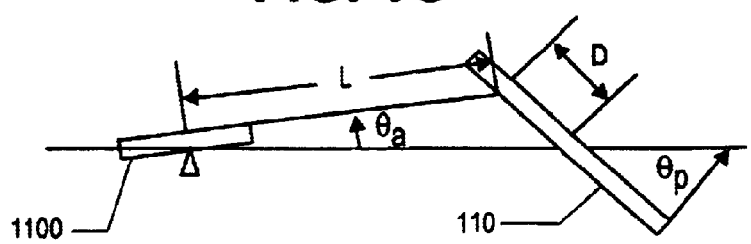
Figure 4D:
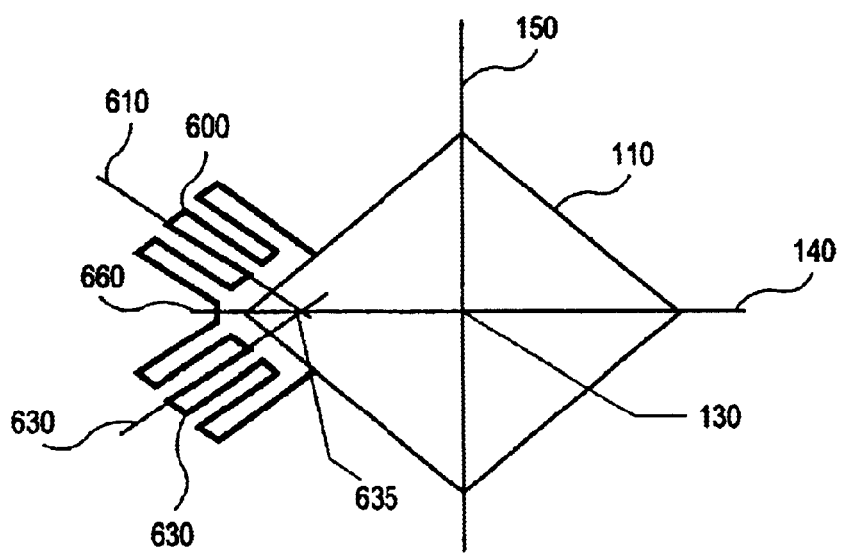

Another gimbal spring embodiment is illustrated in FIG. 4D. The embodiment illustrated in FIG. 4D is similar to that illustrated in FIG. 4A. However, the spring legs of the component springs 600 and 620 are oriented such that the component compliant axes of the component springs intersect at a location 635, which is much closer to the platform origin 130. In the particular embodiment illustrated, the intersection occurs in the gimbaled platform 110. Variations of this embodiment do not always provide for the intersection of the compliant axes to be in the gimbaled platform 110. However, a key feature of similar gimbal spring embodiments is that the component compliant axes of the component springs intersect each other at a position closer to the platform origin 130 than the centroid of the gimbal spring in the gimbal plane. This arrangement places the effective pivot of the gimbal spring closer to the platform origin 130, and thereby increases the leverage ratio in the manner depicted by FIG. 1D.

Figure 5A:
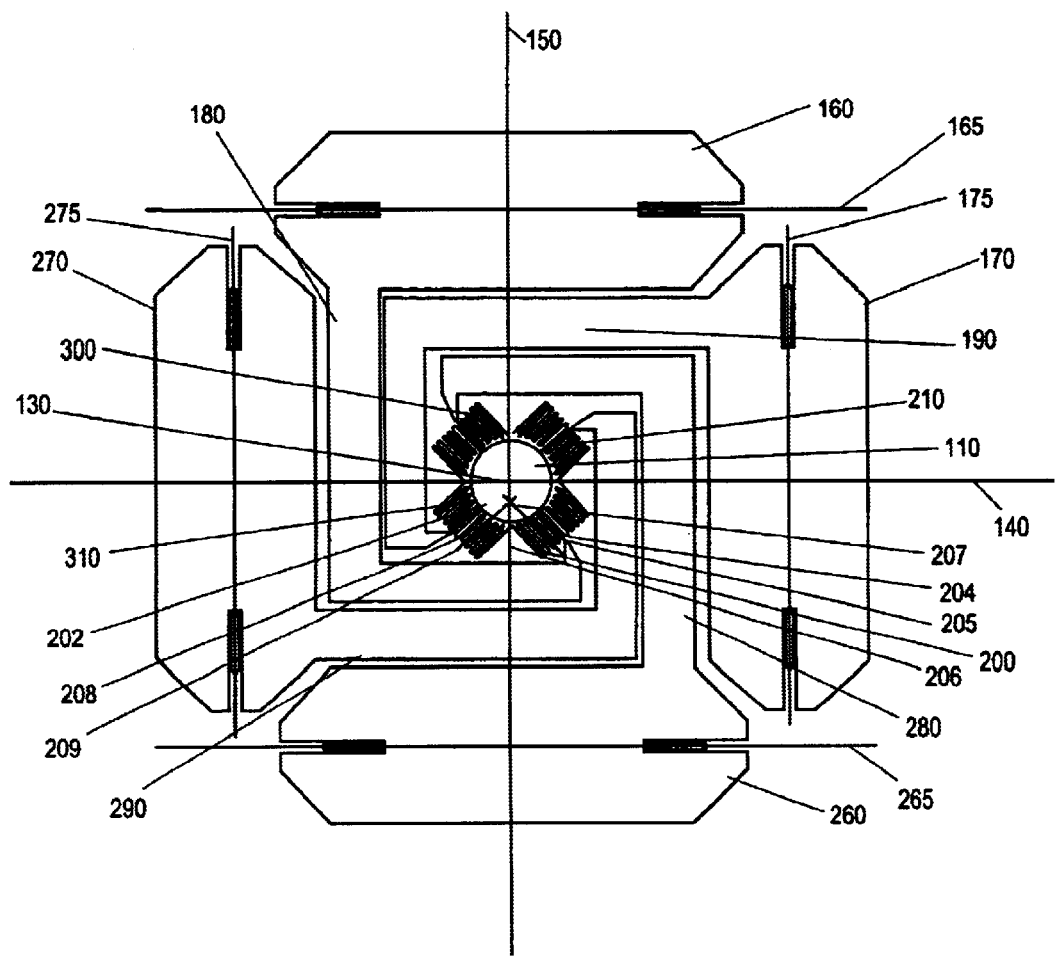
FIG. 5A shows an embodiment with wraparound lever arms.

The most preferred embodiments of the invention employ four rotatable actuators. An example embodiment is illustrated in FIG. 5A. This plan view of the gimbal plane shows a gimbaled platform 110 with a circular platform is shown. The x-axis 140 and the y-axis 150 intersect at the platform origin 130.

This embodiment includes a first x-rotatable actuator 160 that is capable of rotating about a first x-actuator axis 165. The first x-actuator axis 165 is substantially parallel to the x-axis 140 and the first x-actuator axis 165 is disposed in the gimbal plane. A second x-rotatable actuator 260 is capable of rotating about a second x-actuator axis 265. The second x-actuator axis 265 is substantially parallel to the x-axis 140 and is disposed in the gimbal plane. The first x-actuator axis 165 and the second x-actuator axis 265 are disposed on opposite sides of the x-axis 140. They are shown as being symmetrically disposed on the opposite sides of the x-axis 140. Although the symmetry is desirable, it is not required. Similarly, a first y-rotatable actuator 170 is capable of rotating about a first y-actuator axis 175 and a second y-rotatable actuator 270 is capable of rotating about a second y-actuator axis 275. The first 175 and second 275 y-actuator axes are substantially parallel to the y-axis 150 and the first 175 and second 275 y-actuator axes are disposed in the gimbal plane, but on opposite sides of the y-axis 150.

A first x-wraparound lever arm 180 is coupled to the first x-rotatable actuator 160. A second x-wraparound lever arm 280 is coupled to the second x-rotatable actuator 260. Similarly, first 190 and second 290 y-wraparound lever arms are coupled to the first 170 and second 270 y-rotatable actuators.

A first x-gimbal spring 200 couples the first x-wraparound lever arm 180 to the gimbaled platform 110. The first x-gimbal spring 200 attaches to the gimbaled platform 110 at a first x-gimbal-spring/gimbaled-platform attachment point 202. Similarly, a second x-gimbal spring 300 couples the second x-wraparound lever arm 280 to the gimbaled platform 110 and first 210 and second 310 y-gimbal springs couple the first 190 and second 290 y-wraparound lever arms to the gimbaled platform 110. To avoid excessive clutter, the additional attachment points to the gimbaled platform 110 are not labeled.

The first x-rotatable actuator 160, the first x-wraparound lever arm 180, and the first x-gimbal spring 200 are configured such that a positive rotation of the first x-rotatable actuator 160 about the first x-actuator axis 165 induces a positive rotation of the gimbaled platform 110 about the x-axis 140. The other rotatable actuators, wraparound lever arms and gimbal springs are similarly configured such that the rotation of the gimbaled platform 110 in response to an actuator rotation is in the same sense as the rotation of the respective actuator. In some embodiments with wraparound lever arms, a positive rotation of the first x-rotatable actuator 160 may induce some rotation of the gimbaled platform 110 about the y-axis 150 in addition to a positive rotation about the x-axis 140. The invention is intended to include such embodiments.

The gimbal springs shown in FIG. 5A are of the type shown in FIG. 4D. Each gimbal spring comprises two component springs coupled in series. The first component spring 204 has a first component compliant axis 205 and the second component spring 208 has a second component compliant axis 209. The component compliant axes intersect at 207, where they make an angle relative to each other. In the embodiment shown, this angle is approximately 90 degrees and the component compliant axes each form an angle of approximately 45 degrees with both the x-axis 140 and the y-axis 150. As discussed in relation to FIG. 4D, the intersection 207 of the component compliant axes occurs closer to the platform origin 130 than the centroid (the location of which is approximately shown by 206) of the gimbal spring 200 in the gimbal plane. In this particular embodiment, the intersection 207 occurs in the gimbaled platform 110. Also note that the centroid 206 is located further from the platform origin 130 than the first x-gimbal-spring/gimbaled-platform attachment point 202. In the embodiment shown, the two component springs are directly coupled. Alternative embodiments may include a connecting member that is either flexible or substantially rigid.

Figure 5B:
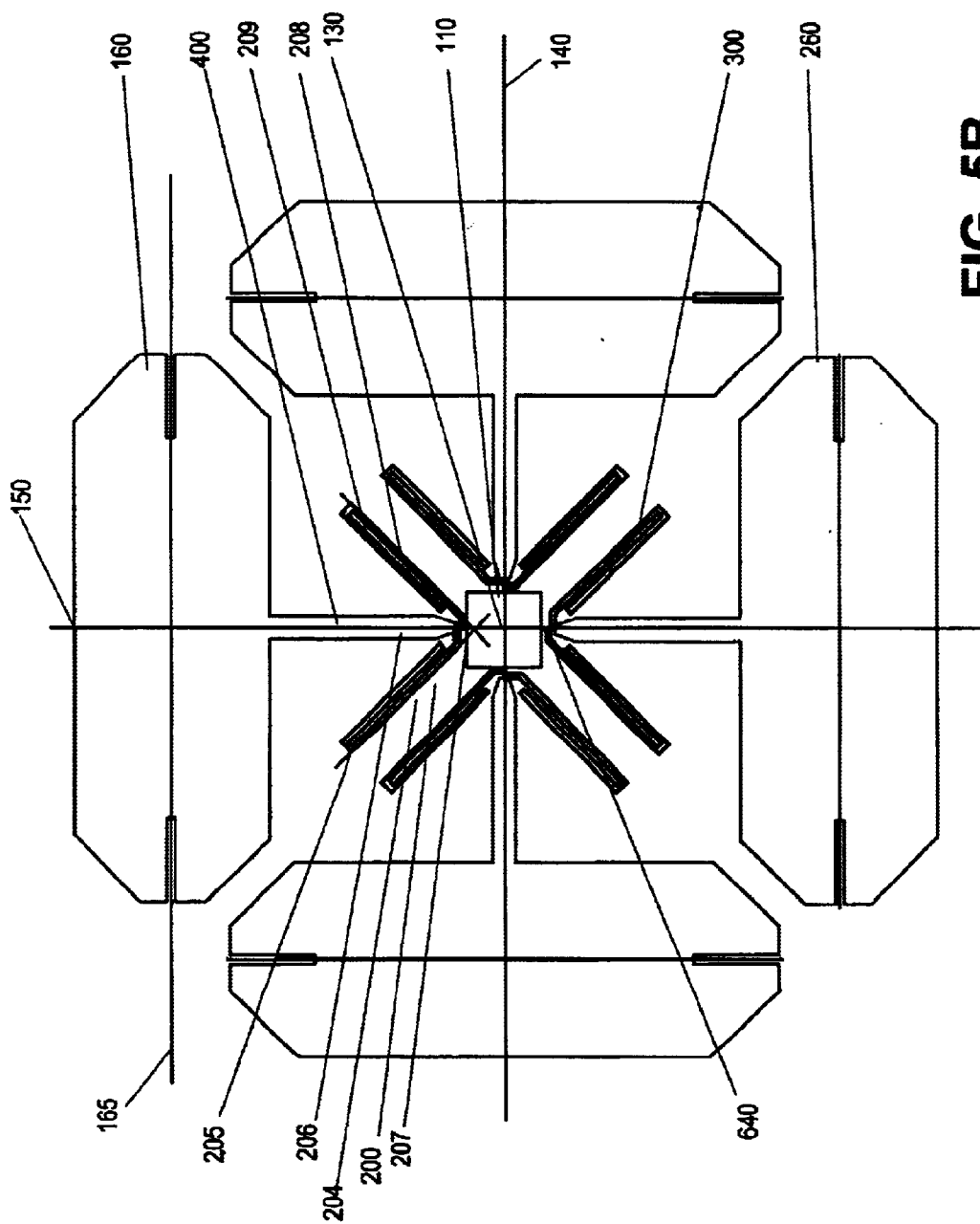
FIG. 5B shows an embodiment without wraparound lever arms.

FIG. 5B illustrates another embodiment that employs similar gimbal springs, but each lever arm is not of the wraparound type. In this embodiment, the gimbaled platform 110 has a square shape in the gimbal plane. The gimbaled platform 110 is capable of rotating about the x-axis 140 and the y-axis 150. The first x-rotatable actuator 160 rotates about the first x-actuator axis 165, which is substantially parallel to the x-axis 140 and is disposed in the gimbal plane. A first x-lever arm 400 is coupled to the first x-rotatable actuator 160. A first x-gimbal spring 200 couples the first x-lever arm 400 to the gimbaled platform 110. The first x-gimbal spring 200 comprises two component springs, a first component spring 204, having a first component compliant axis 205 and a second component spring 208, having a second component compliant axis 209. The first 205 and second 209 compliant axes each make an angle of approximately 45 degrees relative to the x-axis 140 and the y-axis 150. In this embodiment, similar configurations exist for a second x-rotatable actuator 260, and first and second y-rotatable actuators (shown but not labeled).

In this embodiment, the first x-lever arm 400 does not wrap around the gimbaled platform 110. Instead, the configuration of the first x-rotatable actuator 160, the first x-lever arm 400, and the first x-gimbal spring 200 is such that a positive rotation of the first x-rotatable actuator 160 induces a negative rotation of the gimbaled platform 110.

In the embodiments illustrated in FIGS. 5A and B, the first 204 and second 208 component springs are comprised of spring legs, wherein the leg depth is substantially greater than the leg width. Hence, focusing now on the first component spring 204, the spring legs tend to twist about an axis that is substantially parallel to the component compliant axis 205 of the component spring 204 when the gimbal spring 200 is flexed.

In the embodiment illustrated in FIG. 5B, the first component compliant axis 205 and the second component compliant axis 209 intersect each other at a location 207 that is closer to the platform origin 130 than the centroid 206 of the first x-gimbal spring 200 in the gimbal plane. Unlike the embodiment of FIG. 5A, in this particular embodiment, the intersection is not in the gimbaled platform.

The gimbal spring 200 of the embodiment shown in FIG. 5B includes a connecting member that couples the first 204 and second 208 component springs. Because of clutter in the figure, in the vicinity of the first x-gimbal spring 200, the connecting member 640 is labeled as part of the second x-gimbal spring 300. The connecting element 640 may be substantially rigid, or it may be flexible. In some embodiments, the first 204 and second 208 component springs are coupled directly together.

One advantage of the four-actuator design is that the rotation of the first 160 and second 206 x-rotatable actuators can be coordinated such that the gimbaled platform 110 is rotated without any net out-of-plane displacement and without stressing the gimbaled platform 110, as described in Nasiri Ser. No. (09/77,9189). The rotation of the first 170 and second 270 y-rotatable actuators can be similarly coordinated. In the case of wraparound lever arms, as in the embodiment of FIG. 5A, a positive rotation (with respect to the x-axis 140) of the first 160 and second 260 x-rotatable actuators induces a positive rotation (with respect to the x-axis 140) of the gimbaled platform 110. In the case of the lever arms of the embodiment illustrated in FIG. 5B, positive rotation of the first 160 and second 260 x-rotatable actuators induces a negative rotation of the gimbaled platform 110. Rotating the gimbaled platform 110 without net out-of-plane displacement, and without stressing the gimbaled platform 110 is generally desirable. In addition, in a well-designed four-actuator embodiments, the displacement of any component spring can be limited to 20 $\mu$m when the gimbaled platform is rotated by as much as 10 degrees.

Figure 6A:
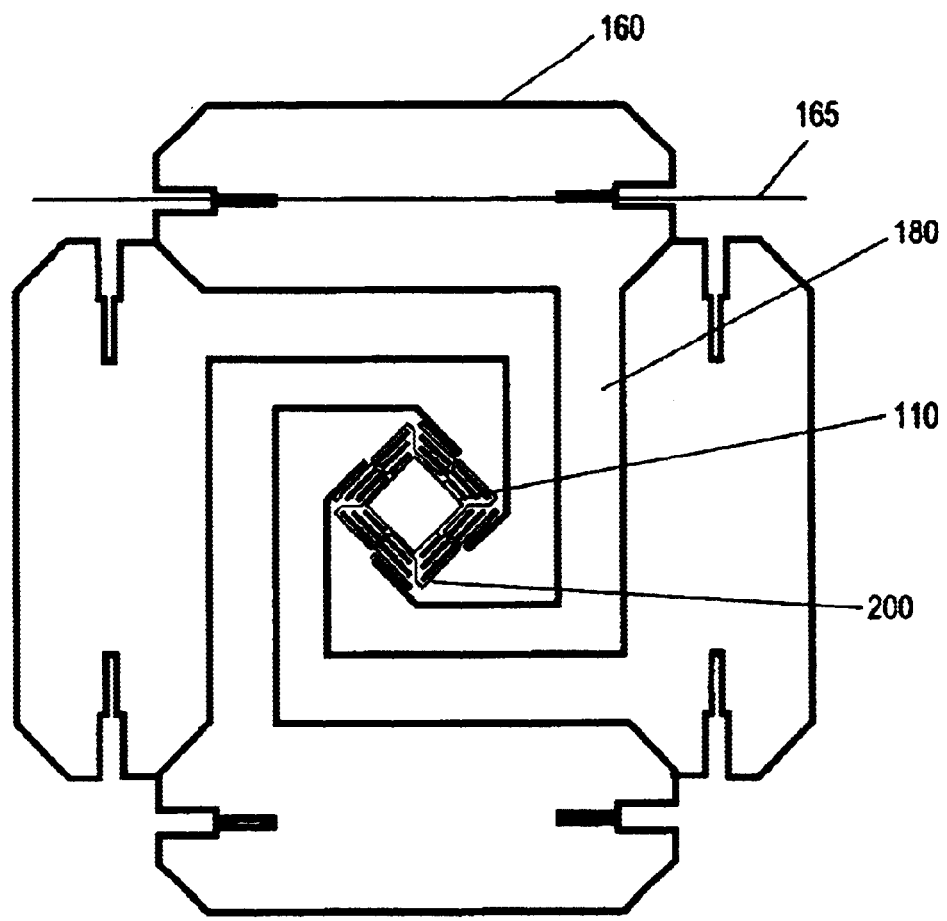
FIG. 6A shows a view including the actuators.

FIG. 6A illustrates another four-actuator embodiment. The gimbaled platform 110 is coupled to the first x-gimbal spring 200, which is connected to the first x-wraparound lever arm 180, which is coupled to the first x-rotatable actuator 160, which rotates about the first x-actuator axis 165. The corresponding second x-actuator, wraparound lever arm, and gimbal spring as well as the various y-components are shown but not labeled in the figure.

Figure 6B:
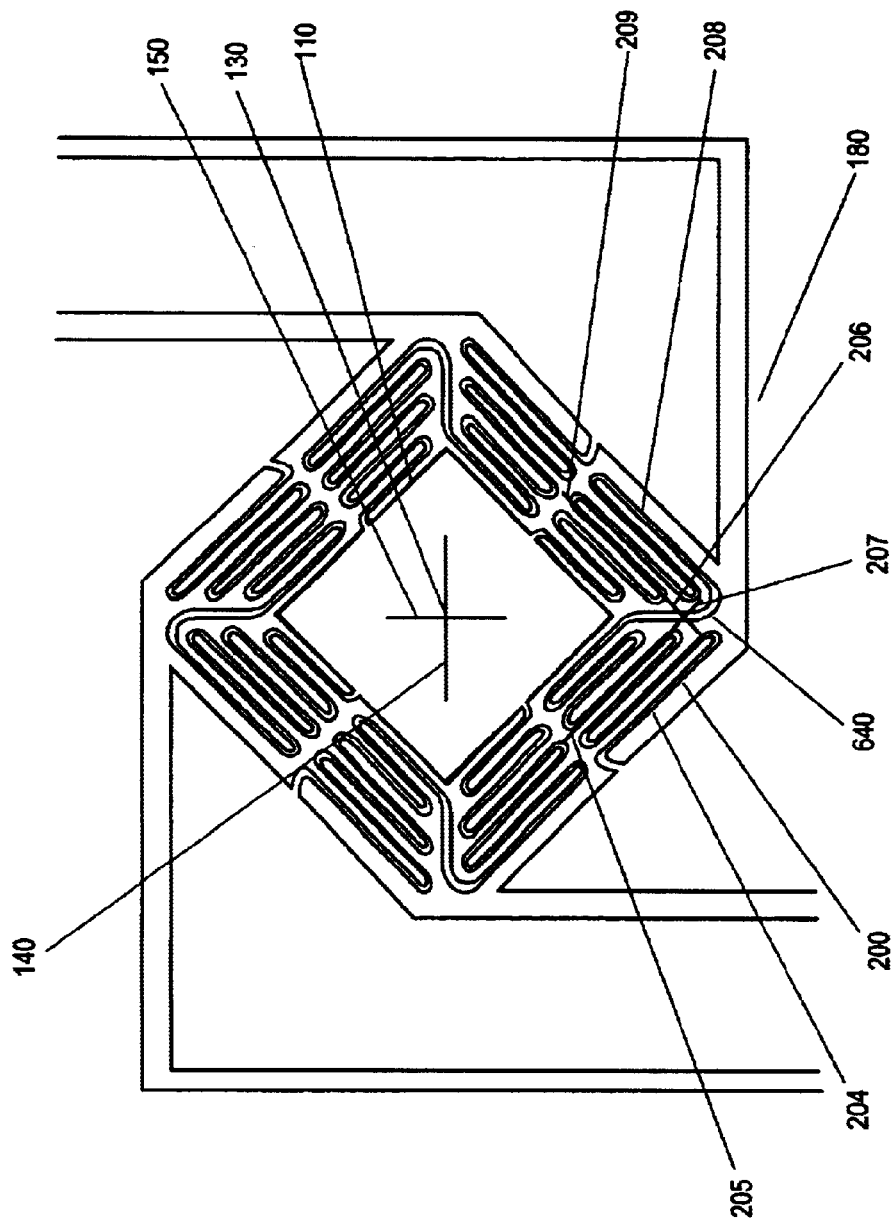
FIG. 6B shows a closeup of the gimbaled platform and the gimbal springs.

FIG. 6B shows a closeup of the gimbaled platform 110 and the gimbal springs. In this embodiment, the gimbaled platform 110 has a diamond shape with its corners aligned with the x-axis 140 and the y-axis 150. The first x-wraparound lever arm 180 couples to the first x-gimbal spring 200. The gimbal springs are similar in type to that illustrated in FIG. 4A. The first x-gimbal spring 200 is comprised of two component springs, a first component spring 204 with first component compliant axis 205 and a second component spring 208 with a second component compliant axis 209. The component compliant axes intersect at 207. In this configuration, the intersection of the component compliant axes is further from the platform origin 130 than the centroid 206 in the gimbal plane. The connecting member 640 can be either flexible or substantially rigid. Alternative embodiments directly couple the first 204 and second 208 component springs.

Figure 7:
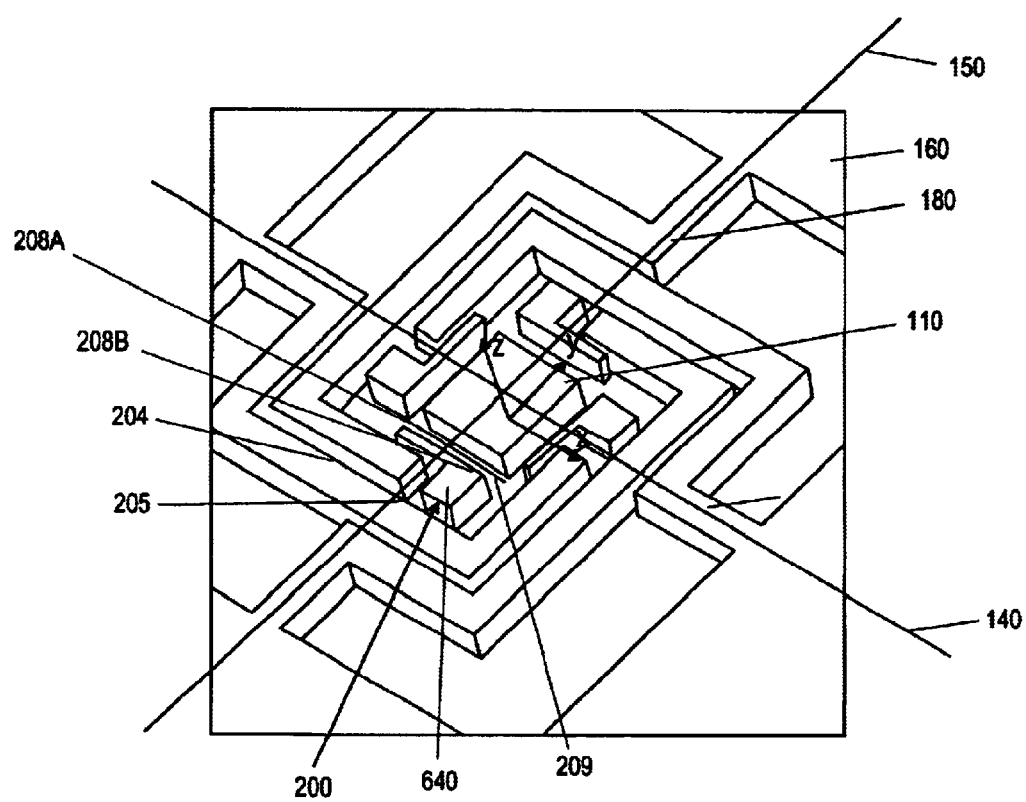
FIG. 7 shows a perspective view of a four-actuator embodiment that employs component springs that have spring legs with leg width greater than depth.

FIG. 7 is a perspective view that shows an embodiment in which the component springs of the gimbal springs are similar to what is shown in FIG. 4B. The first x-rotatable actuator 160 is coupled to a first x-wraparound lever arm 180. The first x-gimbal spring 200 couples the first x-wraparound lever arm 180 to the gimbaled platform 110. The first x-gimbal spring 200 includes a first component spring 204 with a first component compliant axis 205 and second component spring with spring legs 208a and 208b, which have second component compliant axis 209. The first component spring 204 has one leg with leg width substantially greater than leg depth. Similarly the leg widths of spring legs 208a and 208b are substantially greater than the leg depths. These spring legs bend along an axis that is substantially parallel to the component compliant axis of the respective component springs.

Figure 8:
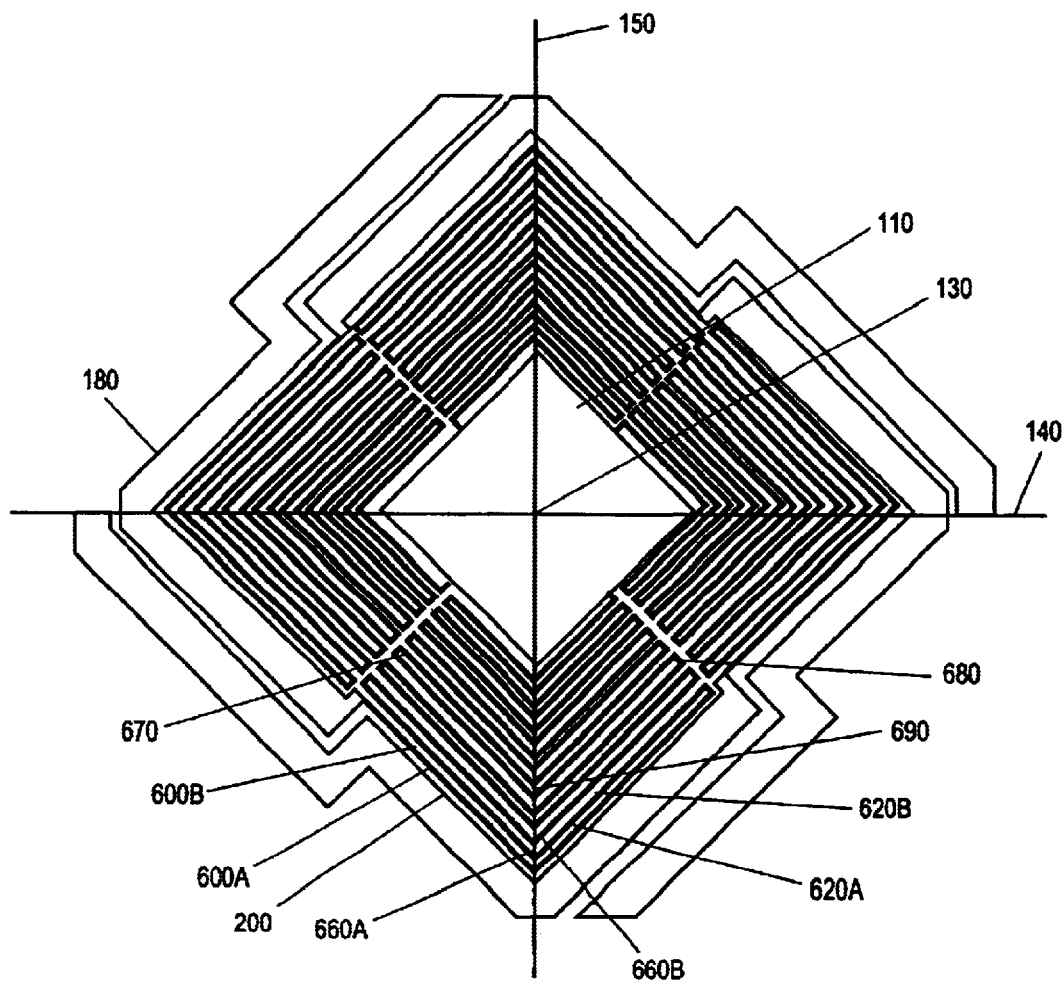
FIG. 8 shows a plan view of an embodiment with gimbal springs that are arranged as gimbal-spring pairs.

FIG. 8 illustrates an embodiment with multiple gimbal springs of the type shown in FIG. 4C. In the gimbal plane the gimbaled platform 110 has a diamond shape with the x-axis 140 and the y-axis 150 passing through the corners of the diamond. The first x-wraparound lever arm 180 is coupled to the first x-rotatable actuator (not shown). In this embodiment, the first x-gimbal spring 200 comprises multiple component springs, each having one leg. Hence the first component spring has spring leg 600a and the second component spring has spring leg 620a. The component springs are coupled in series to form a component spring pair 660a. The first x-gimbal spring 200 is comprised of a plurality of component spring pairs, such as 660a and 660b. In the embodiment viewed here, the leg depths are substantially greater than the leg widths. Each component spring has its component compliant axis along the length of its spring leg. In the embodiment shown, the component compliant axes intersect the x-axis 140 and the y-axis 150 at approximately 45 degrees. The entire first x-gimbal spring 200 has effective compliant axes 670 and 680, which intersect at a location 690, which becomes the effective pivot point for the coupling between the first x-rotatable actuator and the gimbaled platform 110.

Figure 9:
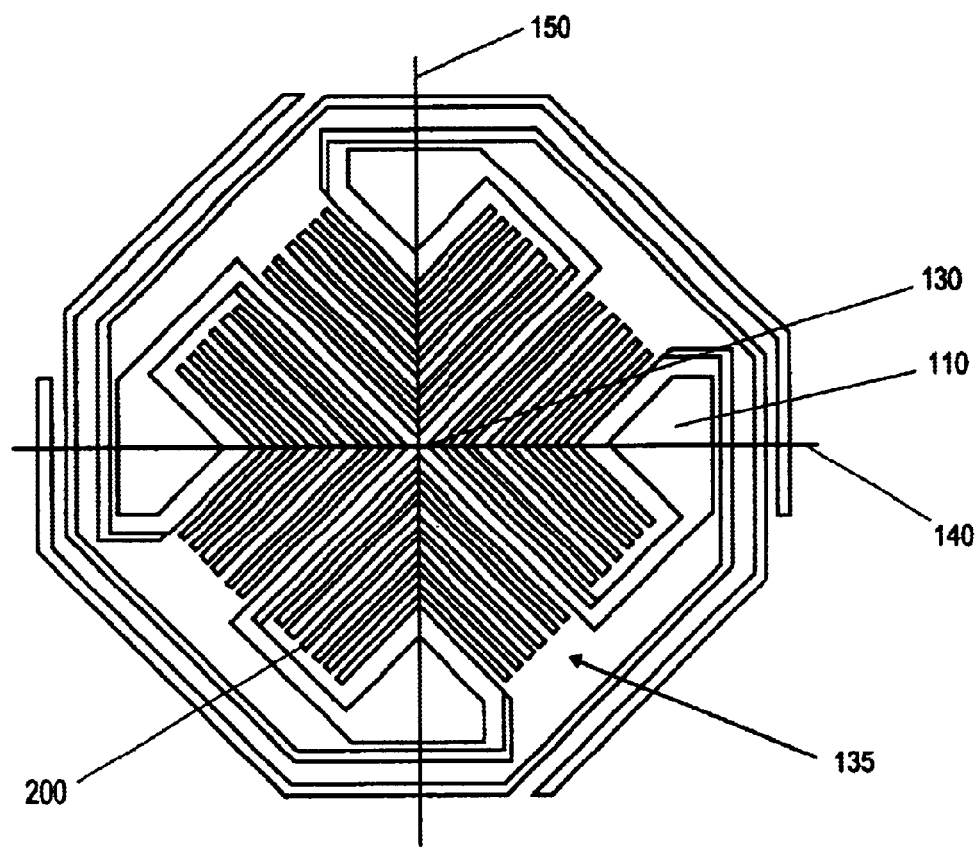
FIG. 9 show a four-actuator embodiment wherein the gimbaled platform provides partial enclosures in which the gimbal springs are disposed.

The embodiment shown in FIG. 9 includes a gimbaled platform 110 that has been modified to form partial enclosures, the first x-partial enclosure being labeled 135. The first x-gimbal spring 200 is disposed within the first x-partial enclosure 135. In this embodiment, similar partial enclosures are provided for the other gimbal springs. In this embodiment, the gimbal springs comprise component spring pairs, but other types of gimbal springs could also be used. Embodiments such as the one illustrated in FIG. 9 place the effective pivot well inside the gimbaled platform 110, close to the platform origin 130 at the intersection of the x-axis 140 and the y-axis 150, thereby providing relatively large leverage ratios.

Figure 10:
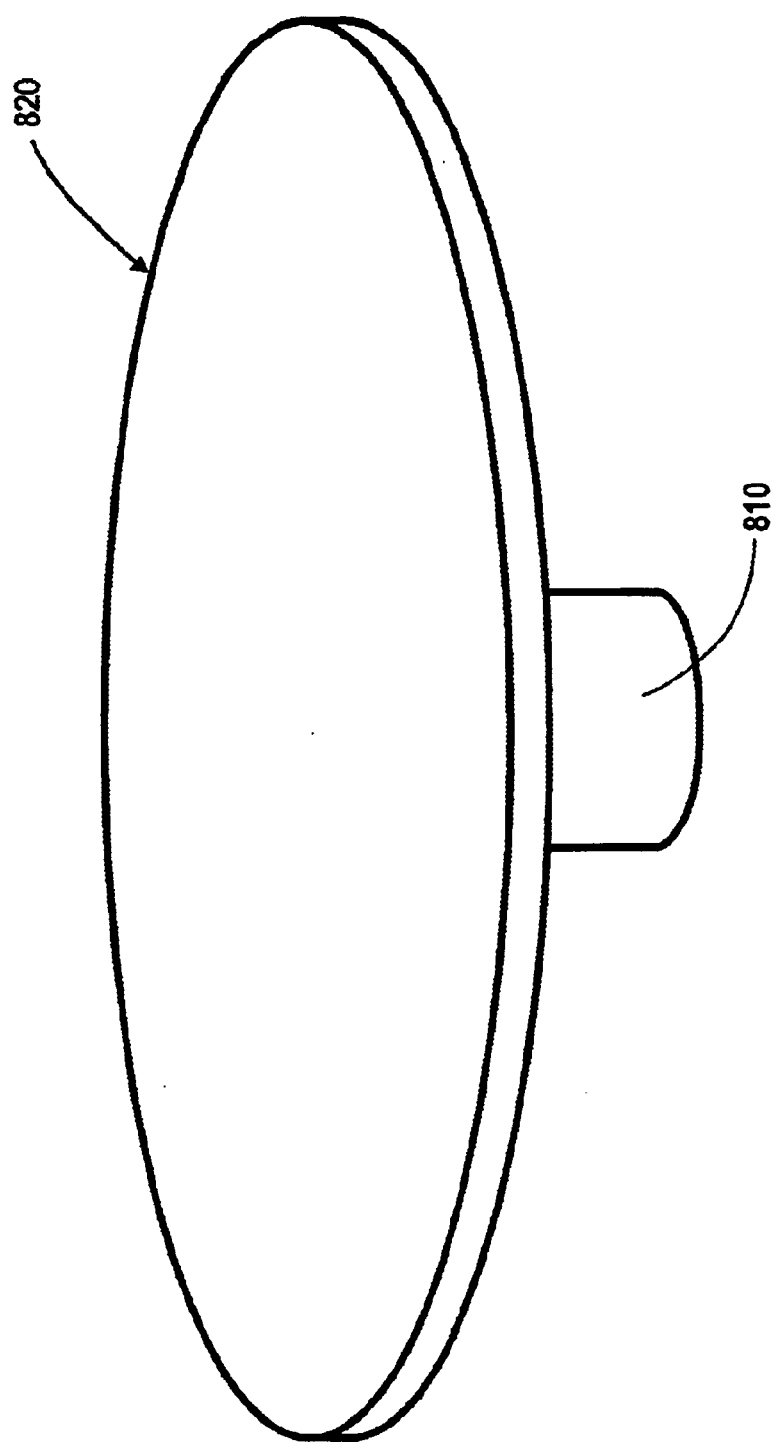
FIG. 10 shows a mirror coupled to a post that can be coupled to a gimbaled platform.

FIG. 10 shows a post 810 coupled to a mirror 820. By coupling the post 810 to the gimbaled platform in the previously shown embodiments, the mirror 820 may be rotatated. Arrays of such mirrors can be used to directly switch optically encoded data in an optical network.

The above-described micro-mechanical rotation systems can be fabricated with known MEMS fabrication techniques. Details of how similar systems are fabricated in the context of a mirror array are described by Nasiri, Smith, Marx, and Novack in U.S. patent application Ser. No. 09/894,021, filed Jun. 27, 2001, which is hereby incorporated by reference in it entirety.

The above description and drawings are only illustrative of preferred embodiments, and the present invention is not intended to be limited thereto. For instance, although the gimbal springs in any particular embodiment have been shown as all having similar construction, different types of gimbal springs (for instance, one similar to that of FIG. 4A and one similar to that of FIG. 4D) may be mixed in an embodiment. Similarly, different types of component springs may be mixed in an embodiment, wraparound lever arms may be mixed with nonwraparound lever arms, either wraparound or nonwraparound lever arms may be used with the various gimbal springs, and the high degree of symmetry shown in the preferred embodiments may be broken. Any additional modification of the present invention that comes within the spirit and scope of the following claims is considered part of the present invention.

What is claimed is:

1. An apparatus, comprising:
    a gimbaled platform capable of rotating about an x-axis and a y-axis, the intersection of the x-axis and y-axis defining a platform origin and a gimbal plane;

a first x-rotatable actuator capable of rotating about a first x-actuator axis, the first x-actuator axis being substantially parallel to the x-axis and disposed in the gimbal plane;

a first y-rotatable actuator capable of rotating about a first y-actuator axis, the first y-actuator axis being substantially parallel to the y-axis and disposed in the gimbal plane;

a first x-wraparound lever arm coupled to the first x-rotatable actuator;

a first y-wraparound lever arm coupled to the first y-rotatable actuator;

a first x-gimbal spring, coupling the first x-wraparound lever arm to the gimbaled platform, the first x-gimbal spring attaching to the gimbaled platform at a first x-gimbal-spring/gimbaled-platform attachment point; and a first y-gimbal spring, coupling the first y-wraparound lever arm to the gimbaled platform, the first y-gimbal spring attaching to the gimbaled platform at a first y-gimbal-spring/gimbaled-platform attachment point;

wherein each gimbal spring comprises at least two component springs coupled in series, each of the component springs having a component compliant axis, the component compliant axis of the at least two component springs making a nonzero angle relative to each other; and wherein the first x-rotatable actuator, the first x-wraparound lever arm, and the first x-gimbal spring are configured such that a positive rotation of the first x-rotatable actuator about the first x-actuator axis induces a positive rotation of the gimbaled platform about the x-axis and wherein the first y-rotatable actuator, the first y-wraparound lever arm, and the first y-gimbal spring are configured such that a positive rotation of the first y-rotatable actuator about the first y-actuator axis induces a positive rotation of the gimbaled platform about the y-axis.

2. The apparatus, according to claim 1, wherein each component compliant axis of the component springs of at least one gimbal spring forms an angle of approximately 45 degrees with respect to both the x-axis and the y-axis.

3. The apparatus, according to claim 2, further comprising:

a second x-rotatable actuator capable of rotating about a second x-actuator axis, the second x-actuator axis being substantially parallel to the x-axis and disposed in the gimbal plane, the first x-actuator axis and the second x-actuator axis being on opposite sides of the x-axis;

a second y-rotatable actuator capable of rotating about a second y-actuator axis, the a second y-actuator axis being substantially parallel to the y-axis and disposed in the gimbal plane, the first y-actuator axis and the second y-actuator axis being on opposite sides of the y-axis;

a second x-wraparound lever arm coupled to the second x-rotatable actuator;

a second y-wraparound lever arm coupled to the second y-rotatable actuator;

a second x-gimbal spring, coupling the second x-wraparound lever arm to the gimbaled platform; and a second y-gimbal spring, coupling the second y-wraparound lever arm to the gimbaled platform;

wherein the second x-rotatable actuator, the second x-wraparound lever arm, and the second x-gimbal spring are configured such that a positive rotation of the second x-rotatable actuator about the second x-actuator axis induces a positive rotation of the gimbaled platform about the x-axis and wherein the second y-rotatable actuator, the second y-wraparound lever arm, and the second y-gimbal spring are configured such that a positive rotation of the second y-rotatable actuator about the second y-actuator axis induces a positive rotation of the gimbaled platform about the y-axis.

4. The apparatus, according to claim 3, wherein the component compliant axes of the component springs of any of the gimbal springs intersect each other closer to the platform origin than the centroid of the respective gimbal spring in the gimbal plane.

5. The apparatus, according to claim 3, wherein the component compliant axes of the component springs of any of the gimbal springs intersect in the gimbaled platform.

6. The apparatus, according to claim 3, wherein each gimbal spring has a centroid in the gimbal plane, the centroid of any gimbal spring being further from the platform origin than the respective gimbal-spring/gimbal-platform attachment point.

7. The apparatus, according to claim 3, wherein at least one component spring of the at least one gimbal spring comprises at least one spring leg, each spring leg having a leg length measured parallel to the component compliant axis of the component spring, a leg width measured in the gimbal plane perpendicular to the component compliant axis, and a leg depth measured perpendicular to the gimbal plane, wherein the leg width is substantially greater than the leg depth.

8. The apparatus, according to claim 3, further comprising:

a post coupled to the gimbaled platform; and a mirror coupled to the post.

9. The apparatus, according to claim 3, wherein at least one component spring of the at least one gimbal spring comprises at least one spring leg, each spring leg having a leg length measured parallel to the component compliant axis of the component spring, a leg width measured in the gimbal plane perpendicular to the component compliant axis, and a leg depth measured perpendicular to the gimbal plane wherein the leg depth is substantially greater than the leg width.

10. The apparatus, according to claim 9, wherein the at least one component spring comprises a plurality of substantially parallel spring legs joined in series; adjacent spring legs being spaced apart by a spring-leg gap.

11. The apparatus, according to claim 10, wherein the mean spring-leg gap is less than approximately two times the leg width.

12. The apparatus, according to claim 10, wherein the mean spring-leg gap is less than approximately 3 $\mu$m.

13. The apparatus, according to claim 9, wherein the component springs of the at least one gimbal spring are coupled through a substantially rigid member.

14. The apparatus, according to claim 9, wherein the component springs of the at least one gimbal spring are coupled directly together.

15. The apparatus, according to claim 9, wherein the component springs of the at least one gimbal spring are coupled through a flexible member.

16. The apparatus, according to claim 9, wherein the component compliant axes of the component springs of any of the gimbal springs intersect each other closer to the platform origin than the centroid of the respective gimbal spring in the gimbal plane.

17. The apparatus, according to claim 1, wherein for at least one gimbal spring:
   two component springs coupled in series form a component spring pair, the component compliant axes of the component springs in the component spring pair being approximately orthogonal and forming an approximately 45 degree angle with the x-axis and y-axis; and wherein:
   each component spring of the component spring pair comprises a spring leg having a leg length measured parallel to the component compliant axis of the component spring, a leg width measured in the gimbal plane perpendicular to the component compliant axis, and a leg depth measured perpendicular to the gimbal plane, the leg depth being substantially greater than the leg width.

18. The apparatus, according to claim 17, further comprising:
   a second x-rotatable actuator capable of rotating about a second x-actuator axis, the second x-actuator axis being substantially parallel to the x-axis and disposed in the gimbal plane, the first x-actuator axis and the second x-actuator axis being on opposite sides of the x-axis;
   a second y-rotatable actuator capable of rotating about a second y-actuator axis, the second y-actuator axis being substantially parallel to the y-axis and disposed in the gimbal plane, the first y-actuator axis and the second y-actuator axis being on opposite sides of the y-axis;
   a second x-wraparound lever arm coupled to the second x-rotatable actuator;
   a second y-wraparound lever arm coupled to the second y-rotatable actuator;
   a second x-gimbal spring, coupling the second x-wraparound lever arm to the gimbaled platform; and
   a second y-gimbal spring, coupling the second y-wraparound lever arm to the gimbaled platform;
   wherein the second x-rotatable actuator, the second x-wraparound lever arm, and the second x-gimbal spring are configured such that a positive rotation of the second x-rotatable actuator about the second x-actuator axis induces a positive rotation of the gimbaled platform about the x-axis and
   wherein the second y-rotatable actuator, the second y-wraparound lever arm, and the second y-gimbal spring are configured such that a positive rotation of the second y-rotatable actuator about the second y-actuator axis induces a positive rotation of the gimbaled platform about the y-axis.

19. The apparatus, according to claim 18, wherein the at least one gimbal spring further comprises a plurality of component spring pairs coupled in series.

20. The apparatus, according to claim 19, wherein spring legs in adjacent spring pairs are spaced apart by a mean spring-leg gap that is less than approximately two times the leg width.

21. The apparatus, according to claim 19, wherein spring legs in adjacent spring pairs are spaced apart by a mean spring-leg gap is less than approximately 3 $\mu$m.

22. The apparatus, according to claim 1, wherein the gimbaled platform forms a partial enclosure and at least one gimbal spring is disposed within the partial enclosure.

23. The apparatus, according to claim 22, wherein two component springs coupled in series form a component spring pair, the component compliant axis of the component springs in the component spring pair being approximately orthogonal and forming approximately 45 degree angles with the x-axis and y-axis.

24. The apparatus, according to claim 23, further comprising:
   a second x-rotatable actuator capable of rotating about a second x-actuator axis, the second x-actuator axis being substantially parallel to the x-axis and disposed in the gimbal plane, the first x-actuator axis and the second x-actuator axis being on opposite sides of the x-axis;
   a second y-rotatable actuator capable of rotating about a second y-actuator axis, the second y-actuator axis being substantially parallel to the y-axis and disposed in the gimbal plane, the first y-actuator axis and the second y-actuator axis being on opposite sides of the y-axis;
   a second x-wraparound lever arm coupled to the second x-rotatable actuator;
   a second y-wraparound lever arm coupled to the second y-rotatable actuator;
   a second x-gimbal spring, coupling the second x-wraparound lever arm to the gimbaled platform; and
   a second y-gimbal spring, coupling the second y-wraparound lever arm to the gimbaled platform;
   wherein the second x-rotatable actuator, the second x-wraparound lever arm, and the second x-gimbal spring are configured such that a positive rotation of the second x-rotatable actuator about the second x-actuator axis induces a positive rotation of the gimbaled platform about the x-axis and
   wherein the second y-rotatable actuator, the second y-wraparound lever arm, and the second y-gimbal spring are configured such that a positive rotation of the second y-rotatable actuator about the second y-actuator axis induces a positive rotation of the gimbaled platform about the y-axis.

25. The apparatus, according to claim 24, wherein for each gimbal spring:
   each component spring of the component spring pair comprises a spring leg having a leg length measured parallel to the component compliant axis of the component spring, a leg width measured in the gimbal plane perpendicular to the component compliant axis, and a leg depth measured perpendicular to the gimbal plane, the leg depth being substantially greater than the leg width.

26. The apparatus, according to claim 25, wherein each gimbal spring further comprises a plurality of component spring pairs coupled in series.

27. The apparatus, according to claim 1, further comprising:
   a second x-rotatable actuator capable of rotating about a second x-actuator axis, the second x-actuator axis being substantially parallel to the x-axis and disposed in the gimbal plane, the first x-actuator axis and the second x-actuator axis being on opposite sides of the x-axis;
   a second y-rotatable actuator capable of rotating about a second y-actuator axis, the second y-actuator axis being substantially parallel to the y-axis and disposed in the gimbal plane, the first y-actuator axis and the second y-actuator axis being on opposite sides of the y-axis;
   a second x-wraparound lever arm coupled to the second x-rotatable actuator;
   a second y-wraparound lever arm coupled to the second y-rotatable actuator;
   a second x-gimbal spring, coupling the second x-wraparound lever arm to the gimbaled platform; and a second y-gimbal spring, coupling the second y-wraparound lever arm to the gimbaled platform;

wherein the second x-rotatable actuator, the second x-wraparound lever arm, and the second x-gimbal spring are configured such that a positive rotation of the second x-rotatable actuator about the second x-actuator axis induces a positive rotation of the gimbaled platform about the x-axis and wherein the second y-rotatable actuator, the second y-wraparound lever arm, and the second y-gimbal spring are configured such that a positive rotation of the second y-rotatable actuator about the second y-actuator axis induces a positive rotation of the gimbaled platform about the y-axis.

28. The apparatus, according to claim 27, further comprising:
a post coupled to the gimbaled platform; and
a mirror coupled to the post.

29. The apparatus, according to claim 27 wherein the component compliant axes of the at least two component springs of at least one gimbal spring are approximately orthogonal.

30. The apparatus, according to claim 29, wherein the maximum displacement of any component spring out of the gimbal plane is limited to 20 μm when the gimbaled platform is rotated 10 degrees.

31. The apparatus, according to claim 29, wherein at least one component spring of the at least one gimbal spring comprises at least one spring leg, each spring leg having a leg length measured parallel to the component compliant axis of the component spring, a leg width measured in the gimbal plane perpendicular to the component compliant axis, and a leg depth measured perpendicular to the gimbal plane wherein the leg width is substantially greater than the leg depth.

32. The apparatus, according to claim 31, wherein the component springs of the at least one gimbal spring are coupled through a substantially rigid member.

33. The apparatus, according to claim 31, wherein the component springs of the at least one gimbal spring are coupled directly together.

34. The apparatus, according to claim 31, wherein the component springs of the at least one gimbal spring are coupled through a flexible member.

35. An apparatus, comprising:
a gimbaled platform capable of rotating about an x-axis and a y-axis, the intersection of the x-axis and y-axis defining a platform origin and a gimbal plane;
a first x-rotatable actuator capable of rotating about a first x-actuator axis, the first x-actuator axis being substantially parallel to the x-axis and disposed in the gimbal plane;
a first y-rotatable actuator capable of rotating about a first y-actuator axis, the first y-actuator axis being substantially parallel to the y-axis and disposed in the gimbal plane;
a first x-lever arm coupled to the first x-rotatable actuator;
a first y-lever arm coupled to the first y-rotatable actuator;
a first x-gimbal spring, coupling the first x-lever arm to the gimbaled platform, the first x-gimbal spring attaching to the gimbaled platform at a first x-gimbal-spring/gimbaled-platform attachment point; and
a first y-gimbal spring, coupling the first y-lever arm to the gimbaled platform, the first y-gimbal spring attaching to the gimbaled platform at a first y-gimbal-spring/gimbaled-platform attachment point;

wherein at least one gimbal spring comprises at least two component springs coupled in series, each of the component springs having a component compliant axis, the component compliant axis of the at least two component springs making an angle of approximately 45 degrees relative to the x and y axes.

36. The apparatus, according to claim 35, further comprising:
a second x-rotatable actuator capable of rotating about a second x-actuator axis, the second x-actuator axis being substantially parallel to the x-axis and disposed in the gimbal plane, the first x-actuator axis and the second x-actuator axis being on opposite sides of the x-axis;
a second y-rotatable actuator capable of rotating about a second y-actuator axis, the second y-actuator axis being substantially parallel to the y-axis and disposed in the gimbal plane, the first y-actuator axis and the second y-actuator axis being on opposite sides of the y-axis;
a second x-lever arm coupled to the second x-rotatable actuator;
a second y-lever arm coupled to the second y-rotatable actuator;
a second x-gimbal spring, coupling the second x-lever arm to the gimbaled platform; and
a second y-gimbal spring, coupling the second y-lever arm to the gimbaled platform.

37. The apparatus, according to claim 36, further comprising:
a post coupled to the gimbaled platform; and
a mirror coupled to the post.

38. The apparatus, according to claim 36, wherein the component compliant axes of the component springs of the at least one gimbal spring intersect each other closer to the platform origin than the centroid of the respective gimbal spring in the gimbal plane.

39. The apparatus, according to claim 36, wherein the component compliant axes of the component springs of the at least one gimbal spring intersect in the gimbaled platform.

40. The apparatus, according to claim 36, wherein each gimbal spring has a centroid in the gimbal plane, the centroid of the at least one gimbal spring being further from the platform origin than the respective gimbal-spring/gimbaled-platform attachment point.

41. The apparatus, according to claim 36, wherein at least one component spring of the at least one gimbal spring comprises at least one spring leg that bends about an axis substantially parallel to the component compliant axis of the component spring.

42. The apparatus, according to claim 36, wherein at least one component spring of the at least one gimbal spring comprises at least one spring leg, each spring leg having a leg length measured parallel to the component compliant axis of the component spring, a leg width measured in the gimbal plane perpendicular to the component compliant axis, and a leg depth measured perpendicular to the gimbal plane wherein the leg width is substantially greater then the leg depth.

43. The apparatus, according to claim 42, wherein the component springs of the at least one gimbal spring are coupled through a substantially rigid member.

44. The apparatus, according to claim 42, wherein the component springs of the at least one gimbal spring are coupled directly together.

45. The apparatus, according to claim 42, wherein the component springs of the at least one gimbal spring are coupled through a flexible member.

46. The apparatus, according to claim 36, wherein at least one component spring comprises at least one spring leg that twists about an axis substantially parallel to the component compliant axis of the component spring.

47. The apparatus, according to claim 36, wherein at least one component spring of the at least one gimbal spring comprises at least on spring leg, each spring leg having a leg length measured parallel to the component compliant axis of the component spring, a leg width measured in the gimbal plane perpendicular to the component compliant axis, and a leg depth measured perpendicular to the gimbal plane wherein the leg depth is substantially greater than the leg width.

48. The apparatus, according to claim 47, wherein the at least one component spring comprises a plurality of substantially parallel spring legs joined in series; adjacent spring legs being spaced apart by a spring-leg gap.

49. The apparatus, according to claim 48, wherein the mean spring-leg gap is less than approximately two times the leg width.

50. The apparatus, according to claim 48, wherein the mean spring-leg gap is less than approximately 3 $\mu$m.

51. The apparatus, according to claim 47, wherein the component springs of the at least one gimbal are coupled through a substantially rigid member.

52. The apparatus, according to claim 47, wherein the component springs of the at least one gimbal spring are coupled directly together.

53. The apparatus, according to claim 47, wherein the component springs of the at least one gimbal are coupled through a flexible manner.

54. The apparatus, according to claim 47, wherein the component compliant axes of the component springs intersect in the gimbaled platform.

55. The apparatus, according to claim 36, wherein the maximum displacement of any component spring out of the gimbal plane is limited in 20 $\mu$m when the gimbaled platform is rotated 10 degrees.

56. The apparatus, according to claim 35, wherein for the at least one gimbal spring:
two component springs coupled in series form a component spring pair, the component compliant axes of the component spring in the component spring pair being approximately orthogonal and forming an approximately 45 degree angle with the x-axis and y-axis; and wherein:
each component spring of the component spring pair comprises a spring leg having a leg length measured parallel to the component compliant axis of the component spring, a leg width measured in the gimbal plane perpendicular to the component axis, and a leg depth measured perpendicular to the gimbal plane, the leg depth substantially greater than the leg width.

57. The apparatus, according to claim 56, further comprising:
a second x-rotatable actuator capable of rotating about a second x-actuator axis, the second x-actuator axis being substantially parallel to the x-axis and disposed in the gimbal plane, the first x-actuator axis and the second x-actuator axis being on opposite sides of the x-axis;
a second y-rotatable actuator capable of rotating about a second y-actuator axis, the second y-actuator axis being substantially parallel to the y-axis and disposed in the gimbal plane, the first y-actuator axis and the second y-actuator axis being on opposite sides of the y-axis;
a second x-lever arm coupled to the second x-rotatable actuator;
a second y-lever arm coupled to the second y-rotatable actuator;
a second x-gimbal spring, coupling the second x-lever arm to the gimbaled platform; and
a second y-gimbal spring, coupling the second y-lever arm to the gimbaled platform.

58. The apparatus, according to claim 57, wherein the at least one gimbal spring further comprises a plurality of component spring pairs coupled in series.

59. The apparatus, according to claim 58, wherein spring legs in adjacent component spring pairs are spaced apart by a mean spring-leg gap that is less than approximately two times the leg width.

60. The apparatus, according to claim 58, wherein spring legs in adjacent component spring pairs are spaced apart by a mean spring-leg gap is less than approximately 3 $\mu$m.

61. The apparatus, according to claim 35, wherein the gimbaled platform forms a partial enclosure and the at least one gimbal spring is disposed within the partial enclosure.

62. The apparatus, according to claim 61, further comprising:
a second x-rotatable actuator capable of rotating about a second x-actuator axis, the second x-actuator axis being substantially parallel to the x-axis and disposed in the gimbal plane, the first x-actuator axis and the second x-actuator axis being on opposite sides of the x-axis;
a second y-rotatable actuator capable of rotating about a second y-actuator axis, the second y-actuator axis being substantially parallel to the y-axis and disposed in the gimbal plane, the first y-actuator axis and the second y-actuator axis being on-opposite sides of the y-axis;
a second x-lever arm coupled to the second x-rotatable actuator;
a second y-lever arm coupled to the second y-rotatable actuator;
a second x-gimbal spring, coupling the second x-lever arm to the gimbaled platform; and
a second y-gimbal spring, coupling the second y-lever arm to the gimbaled platform.

63. The apparatus, according to claim 62, wherein:
two component springs coupled in series form a component spring pair, the component compliant axes of the component springs in the component spring pair being approximately orthogonal and forming an approximately 45 degree angle with the x-axis and y-axis; and wherein:
each component spring of the component spring pair comprises a spring leg having a leg length measured parallel to the component compliant axis of the component spring, a leg width measured in the gimbal plane perpendicular to the component compliant axis, and a leg depth measured perpendicular to the gimbal plane, the leg depth being substantially greater than the leg width.

64. The apparatus, according to claim 63, wherein each gimbal spring further comprises a plurality of component spring pairs coupled in series.

* * * * *